United States Patent [19]

Chen et al.

[11] Patent Number: 4,679,303
[45] Date of Patent: Jul. 14, 1987

[54] METHOD OF FABRICATING HIGH DENSITY MOSFETS WITH FIELD ALIGNED CHANNEL STOPS

[75] Inventors: John Y. Chen, Los Angeles; Richard C. Henderson, Westlake Village, both of Calif.

[73] Assignee: Hughes Aircraft Company, Los Angeles, Calif.

[21] Appl. No.: 734,806

[22] Filed: May 16, 1985

Related U.S. Application Data

[62] Division of Ser. No. 537,920, Sep. 30, 1983, abandoned.

[51] Int. Cl.$^4$ ............................................. H01L 21/425
[52] U.S. Cl. ......................................... 29/571; 29/576 B; 29/576 W; 29/578; 148/187; 357/23.11; 357/23.12
[58] Field of Search ............... 29/571, 576 W, 576 B, 29/578; 148/187; 357/23.11, 23.12

[56] References Cited

U.S. PATENT DOCUMENTS

| | | | |
|---|---|---|---|
| 3,728,161 | 4/1973 | Moline | 357/23 CS |
| 3,773,566 | 11/1973 | Tsuchimoto | 29/576 B |
| 4,074,301 | 2/1978 | Paivinen et al. | 357/23 C |
| 4,140,547 | 2/1979 | Shibata et al. | 357/23 CS |
| 4,149,307 | 4/1979 | Henderson | 29/571 |
| 4,294,002 | 10/1981 | Jambotkar et al. | 29/571 |
| 4,315,781 | 2/1982 | Henderson | 357/23.12 |
| 4,329,186 | 5/1982 | Kotecha et al. | 29/571 |
| 4,398,964 | 8/1983 | Malwah | 148/187 X |
| 4,426,766 | 1/1984 | Lee | 29/578 X |
| 4,441,941 | 4/1984 | Nozawa | 148/187 |
| 4,485,550 | 12/1984 | Koeneke et al. | 29/571 |

OTHER PUBLICATIONS

IBM Tech Disclosure Bulletin vol. 14 #8 1/72 "Improved Thick-Thin Oxide Ratio" by Siegle.

Primary Examiner—George T. Ozaki
Attorney, Agent, or Firm—Wanda K. Denson-Low; A. W. Karambelas

[57] ABSTRACT

A high-density MOSFET having field oxide self-aligned channel stops for device isolation and an optimal method of fabricating such a device is described. The process provides channel stops underlying and aligned with the edges of a field oxide layer and allows the dopant concentration of the channel stops to be established separately from that of the active device channel region by use of an independant channel stop implant. The active devices thus formed require minimal isolation area, have a high field threshold voltage, a low junction capacitance, and minimal body effect. They are particularly useful in high-speed, high-performance integrated circuits.

10 Claims, 7 Drawing Figures

METHOD OF FABRICATING HIGH DENSITY MOSFETS WITH FIELD ALIGNED CHANNEL STOPS

This application is a division of application Ser. No. 537,920, filed Sept. 30, 1983, abandoned.

BACKGROUND OF THE INVENTION

1. Field of the Invention

The present invention relates to high density, high performance integrated circuits and, in particular, a MOSFET circuit element having field oxide aligned channel stops for device isolation and a process for providing such with optimized doping of the various regions of the active device.

2. Description of the Prior Art

Providing for device isolation has been one of the more critical problems in fabricating integrated circuits. As the packing density increases for VLSI applications, device isolation can place a fundamental limit on circuit design complexity and density. A number of prior art processes for isolating devices in integrated circuits have been available but none have been completely satisfactory due to the severe design constraints which must be adhered to. In particular, a preferred isolation technology should satisfy the following requirements:

(1) Leakage current must be negligible between active devices. For MOS technology, this means the silicon surface under the field oxide cannot be even weakly inverted during circuit operation. Because of shifts in field oxide threshold voltage ($V_{TF}$) due to variations in spacing between active devices, temperature, and radiation exposure, it is necessary to provide adequate margins for $V_{TF}$ shift by making $V_{TF}$ as high as possible, typically, 15-20 volts, to ensure complete VLSI active device isolation.

(2) Spacing between active devices should be minimal. This requirement is particularly important for obtaining VLSI packing densities.

(3) Isolation should not consume a significant portion of the active device area or result in significant narrow-channel effect.

(4) The isolation process should not significantly constrain the process parameters required for fabricating the active device. In this way, the performance and isolation of the active device can be independently optimized.

(5) The isolation process should be relatively simple to control.

(6) For some applications, the above requirements must be maintained in high temperature or radiation environments.

Typical of the conventional MOS processes used for the isolation of active devices in MOS integrated circuits is the local oxidation of silicon (LOCOS) process described in the article by Kooi et al., "Formation of Silicon Nitride at an Si—SiO$_2$ Interface During Heat Treatment of Oxidized Silicon in NH$_3$ Gas", Journal of the Electrochemical, Society, Vol. 123, p. 1117, 1976. In accordance with this method, a nitride mask is provided over the eventual active device areas as a shield during an implantation of boron ions, the isolation areas thereafter being selectively oxidized. However, applying LOCOS for VLSI isolation is limited by field oxide encroachment (bird's beak phenomenon) and by lateral diffusion of channel stop dopants into the eventual active device areas. Both effects overtake the active area near the channel edges. This channel narrowing effect will increase the FET threshold voltage and reduce its current driving capability. To maintain the desired channel width, the corresponding mask dimension must be drawn oversize, resulting in wasted layout area and poor packing density for IC fabrication.

Although subsequently developed LOCOS isolation techniques have reduced the narrow channel effects, other problems, such as process complexity, still make the search for alternative processes for integrated circuit fabrication desirable.

An improvement to the LOCOS process described above is direct window isolation which provides advantages for the isolation in high density ICs. In an article by Wang, et al., "Direct Moat Isolation for VLSI", IEEE Transactions on Electron Devices, ED-29, p. 541, 1982, the placement of LOCOS by direct window isolation is disclosed. This technique employs only a single boron implant to form both channel stops and channel regions. This technique, however, is not completely satisfactory for an optimized MOS process since high junction capacitance and poor body effect for the active devices result, as well as a low field inversion voltage for field oxide regions. Body effect is the sensitivity of threshold voltage to substrate bias. This effect reduces driving current and limits logic swings in MOS integrated circuits.

SUMMARY OF THE INVENTION

The present invention provides high-density, high-performance integrated circuits, and, in particular, a MOSFET circuit element having field oxide self-aligned channel stops for device isolation and a process for fabricating such with optimized doping of the various regions of the active devices. The process steps involve growing or depositing a field oxide over a semiconductor substrate, typically silicon, patterning active areas by a photoresist, etching oxide away from the active areas, implanting a shallow layer of dopant in the active areas, evaporating metal over the substrate and lifting off the remaining photoresist leaving metal over the active areas making a deep dopant implant to form channel stops under the field oxide only, and then removing the remaining metal. In situations wherein both enhancement and depletion mode devices are to be formed on respective active areas of the same substrate, the depletion devices are patterned by photoresist, implanting a shallow dopant layer to form the depletion devices and thereafter removing the photoresists. The devices are then completed by utilizing conventional FET processing technology.

Thus each device fabricated in accordance with the present invention has channel stops that are self-aligned to the field oxide which permits the high packing density necessary for VLSI integrated circuits. The active devices, due to the separate dopant implants for channel stops and active regions, have low junction capacitance and minimum body effect, thus enabling high speed, high performance integrated circuits to be fabricated.

The isolation process according to the teaching of the present invention also provides higher packing densities than conventional processes, particularly NMOS processes, a high field oxide inversion voltage which ensures rigid device isolation even in radiation environments, and virtually no field oxide encroachment or oxidation-induced lateral channel stop dopant diffusion so that the active channel width is not narrowed.

The process described above, in addition to providing the noted advantages, is accomplished in a relatively simple and cost effective manner.

BRIEF DESCRIPTION OF THE DRAWINGS

For a better understanding of the invention as well as other advantages and further features thereof, reference is made to the following description which is to be read in conjunction with the accompanying drawings wherein.

It should be noted that the same reference numerals identify like components in each of the figures.

DETAILED DESCRIPTION OF THE INVENTION

Figure 1:
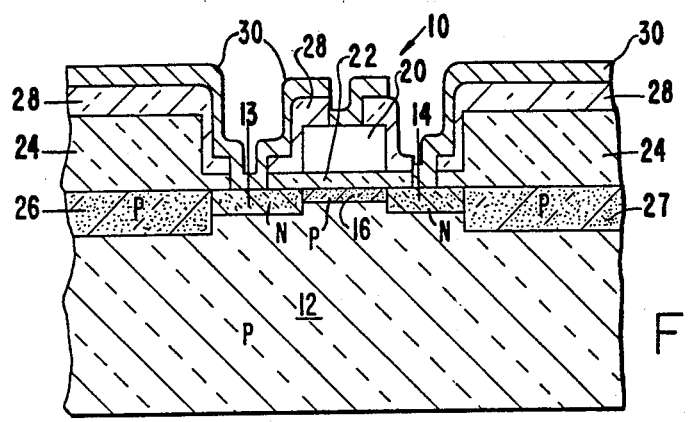
FIG. 1 is a cross-sectional view of a MOSFET device fabricated in accordance with the present invention.

A MOSFET type device 10 incorporating the novel channel stop structure of the present invention is shown in FIG. 1. As will be explained hereinafter with reference to FIGS. 2-7, the isolation process of the present invention can be utilized to form both enhancement and depletion mode MOSFETS in the same integrated circuit. For the purpose of clarity, only the formation of an enhancement MOSFET is shown in FIG. 1. It also should be noted that although the isolation process is described in the context of NMOS devices, PMOS devices can similarly be fabricated with the process. Moreover, the isolation process of the present invention can be utilized in the fabrication of both NMOS and PMOS devices on the same substrate as needed for CMOS. Since NMOS devices, due to their higher speed of operation and smaller size, are more widely used in the industry than PMOS and CMOS devices, the following description will be directed to the fabrication of NMOS devices. Also, the device can be fabricated utilizing essentially any semiconductor and compatible oxide. Preferably, silicon and silicon dioxide are employed. Device 10 comprises a semiconductor substrate 12, here silicon, having an n+ source region 13 and an n+ drain region 14. An active channel 16 is formed at the upper surface of substrate 12 and a gate electrode 20, here polysilicon or silicide, overlies a thin gate oxide layer 22 as illustrated. A thick field oxide layer 24 is formed on the surface of substrate 12 and, as will be explained hereinafter, is utilized in conjunction with channel stop layers 26 and 27 to provide device isolation. A layer 28 of insulating oxide, here silicon dioxide, is formed over the underlying field oxide layer and the gate electrode, preferably by chemical vapor deposition (CVD) techniques. The device 10 is completed by etching holes through the field oxide 24 and insulating oxide 28 layers in areas corresponding to the drain 14, source 13 and gate 20. Contacts and interconnects 30 are then formed in accordance with the desired circuit configuration.

Figure 2:
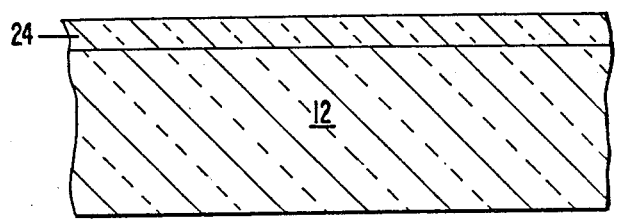
FIGS. 2-7 are cross-sectional views which illustrate the method of fabricating the isolation structure portion of the device of FIG. 1.
Figure 3:
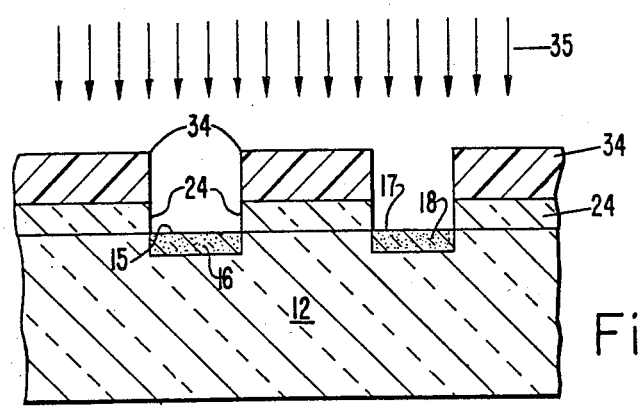

Referring now to FIG. 2, in order to fabricate active devices 10 having an isolation structure consistent with the present invention one starts with a substrate or body 12 of P-type semiconductor material, preferably silicon doped with an impurity such as boron to provide p-type conductivity. A field dioxide layer 24, preferably silicon dioxide is thermally grown or CVD deposited on the surface of substrate 12 by conventional techniques, layer 24 having a thickness in the range from about 4000Å to about 6000Å. Referring to FIG. 3, active areas 15 and 17 are patterned with conventional positive photoresist 34, such as Shipley AZ, and the silicon dioxide overlying the active areas 15 and 17 is etched away in a conventional manner. The thickness of the photoresist layer 34 is in the range from about 1 $\mu$m to about 2 $\mu$m.

A p-type dopant, typically boron, is then implanted as represented by arrows 35, into the active areas 15, 17 to form shallow active channel regions 16, 18 respectively. The implant is preferably performed at an energy in the range from about 20 KeV to about 30 KeV and to a dosage in the range from about $7 \times 10^{11}$ ions/cm$^2$ to about $1.5 \times 10^{12}$ ions/cm$^2$. Alternately a double implant can be utilized for sub-micrometer active channel lengths, with boron initially being implanted at an energy in the range from about 20 KeV to about 30 KeV and a dosage in the range from about $7 \times 10^{11}$ ions/cm$^2$ to about $1 \times 10^{12}$ ions/cm$^2$, and a second step of implanting boron at an energy of about 70 KeV and a dosage of about $4 \times 10^{11}$ ions/cm$^2$. The thickness of both the relatively shallow active channel regions 16 and 18 is in the range from about 0.1 $\mu$m to about 0.3 $\mu$m. Other p-type dopants may be utilized to form the active channel including, for example, gallium, and implanted at energies and dosages which depend on the substrate material and quality and the type of MOSFET device to be fabricated. The implant conditions are chosen such that the performance characteristics of the active devices 10 being fabricated (e.g., low threshold, low punchthrough current, minimum body effect and low junction capacitance) are optimized.

Although the single boron implant can provide desirable device performance for all active channel lengths, it is most effective for channel lengths greater than 1 $\mu$m. Use of the two step boron implant further suppresses the punchthrough effect which is particularly desirable for channel length less than 1 $\mu$m, and is thus preferred in such cases.

Figure 4:
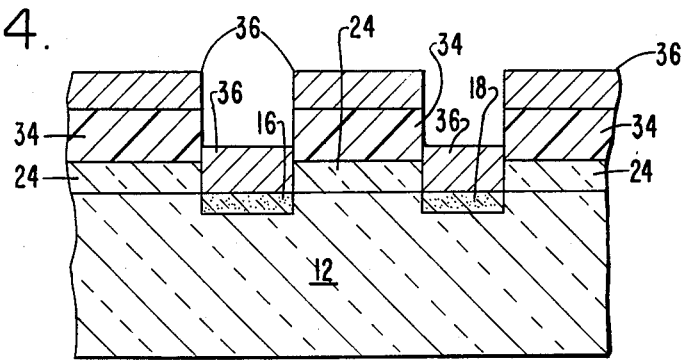
Figure 5:
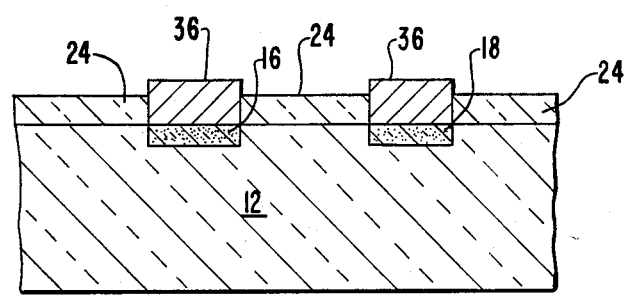
Figure 6:
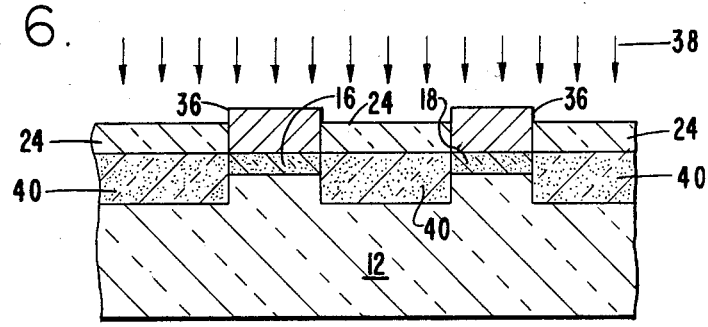

After the shallow boron implant, a layer of metal 36 is evaporated onto the surface of substrate 12 as shown in FIG. 4. Metal layer 36, typically aluminum (Al) or gold (Au), has a thickness in the range from about 0.4 $\mu$m to 0.7 $\mu$m for Au and from about 0.7 $\mu$m to about 1.3$\mu$ for Al. The portion of the metal layer overlying the photoresist layers is removed by a conventional lift-off process by placing the substrate 12 in a chemical organic solution which dissolves the photoresist 34, leaving the metal overlying the active areas 16 and 18 as shown in FIG. 5, (the resist/oxide composite layer acts as a two-level resist which facilitates the lift-off). The next step is to form a deep p+ dopant implant under the field oxide layer 24. The implant energy is selected to be high enough to place the peak implantation concentration just beneath the field oxide (FIG. 6), but insufficient to penetrate the metal layer 36 which masks the active areas. The implant dose (represented by arrows 38) is chosen to provide a relatively high doping concentration for channel stop regions 40 under the field oxide 24. Preferably, boron is implanted through the field oxide 24 at an energy in the range from about 120 KeV to about 200 KeV and to a dosage in the range from about $5 \times 10^{12}$ ions/cm$^2$ to about $1 \times 10^{13}$ ions/cm$^2$. Finally, the metal layer 36 is then stripped by a conventional metal etching process.

At this point in the process, the basic isolation structure fabricated in accordance with the teachings of the present invention is complete. In order to put the invention to proper perspective, the following will briefly describe the process steps utilized to fabricate the device shown in FIG. 1. Naturally, other process techniques and sequences may be used to complete the MOS structure consistent with the present invention.

For illustrative purposes, it is assumed that at least two MOSFETS are being fabricated as part of an integrated circuit and that one MOSFET is an enhancement mode active device and the other a depletion mode active device. The additional processing steps needed to form a depletion mode device will be described with reference to FIG. 7. The depletion device is patterned by a photoresist (conventional masking step is utilized), so as to form a photoresist mask 42 over the channel region, 16 in this case, of the eventual enhancement mode active device. A shallow implant (represented by arrows 44), preferably of arsenic or phosphorus, is then performed to counter-dope the boron implanted region 18 with additional dopant as needed to ultimately form a depletion mode active device. The photoresist layer 42 is then removed and the substrate 12 is ready for conventional processing to form the completed depletion mode and enhancement mode MOSFETs.

Again referring to FIG. 1, a thin oxide gate layer 22 (thickness in the range from about 200Å to about 1000Å) is deposited or thermally grown over the otherwise exposed surface of the substrate 12, a layer of polysilicon 20 then being applied over the thin film oxide layer by chemical vapor deposition (CVD) techniques; the polysilicon film 20 is then doped with phosphorus to make the film conductive; a conventional photoresis masking process is next utilized to define the polysilicon gate 20; the remaining portion of the polysilicon layer and the photoresist layer are stripped away, leaving a polysilicon gate on top of the thin oxide film. Arsenic is then implanted at an energy in the range from about 50 KeV to about 150 KeV and at a dosage in the range from about $1 \times 10^{15}$ ions/cm$^2$ to about $1 \times 10^{16}$ ions/cm$^2$ to form the n-type MOSFET source and drain regions 13 and 14, respectively; a silicon dioxide layer 28 then being formed over the polysilicon gate by chemical vapor deposition techniques to form an insulation layer; another masking and etching procedure is utilized to make appropriate contact holes at the gate and n$^+$ dopant regions; a layer of metal 30, such as aluminum overlying a tungsten-titanium (WTi) film, is evaporated over the substrate surface; and then a masking/etching step is utilized to make the appropriate connections depending upon the circuit configuration desired.

Thus, through the use of the lift-off technique in the above manner consistent with the present invention, separate and, thereby, independently optimizable implants may be utilized to form the channel stop 40 and channel regions 16, 18. Moreover, the channel stop 40 is inherently self-aligned to the edges of the field oxide 24 and the channel regions 16 and 18, thus allowing for accurate placement of the channel stop as required for increased integrated circuit packing densities. It should be noted that this independent doping concentration control eliminates the necessity of counter-doping or providing dopant compensation as is required in the fabrication of prior art devices.

Note that using the field oxide 24 as a mask enables the edges of the underlying channel stop 40 to be aligned with the edges of the field oxide layer 24. This allows the circuit designer to take full advantage of the chip area, thus increasing VLSI packing densities. Also, note that to minimize body effect while suppressing punch through current, the active channel layer implant depth is limited to within the source (drain) junction depth.

Thus, typical channel lengths for devices fabricated in accordance in the present invention may range from about 0.5 μm to about 5 μm and typical implanted channel thickness range from about 0.1 μm to about 0.3 μm. It has been determined that the threshold voltages (defined at 1 μA) for the depletion mode and enhancement mode MOSFETs fabricated in accordance with the teachings of the present invention remain essentially constant (0.25 V for enhancement, −0.75 V for depletion) for a selected substrate bias voltage. Similarly, the threshold voltages vary within a narrow range for relatively larger variations in substrate voltage.

The device isolation characteristics of MOS devices depend on the potential under the field oxide. For a 4000Å field oxide thickness and 200Å gate oxide thickness and an isolation spacing of about 1 μm (distance between active areas), at 5 V gate operation, no field inversion (current channel formation) occurs under the field oxide in devices fabricated in accordance with the present invention. At a gate voltage of 15 volts, no electrons appear in the main area of the isolation region, thus confirming that excellent device isolation characteristics are provided. This is the case even at submicrometer isolation dimensions.

The performance of the active devices fabricated in accordance with the present invention are also enhanced. In particular, it has been determined that there is no severe punchthrough current (when gate length gets smaller and n+ regions become closer together, current [punchthrough] may flow even when gate voltage is not applied) when the devices are operated at typical MOSFET biasing voltages i.e., 5 V. Further, the tailoring of the active channel dopant concentrations to the appropriate values reduces the body effect (change of threshold voltage with change in substrate bias). The junction capacitance between n+ implant regions and the substrate is also reduced by accurately controlling the original shallow boron implant.

The use of direct window isolation by ion implantation eliminates the occurence of field oxide encroachment while the formation of the channel stop after the field oxide growth minimizes oxidation-induced lateral boron diffusion, thus eliminating the physical channel narrowing effect.

A heavily doped substrate normally will increase junction capacitance, decreasing the speed of device operation, and will also increase the body effect, thus changing device performance for a change in substrate bias. The shallow boron active region implant utilized in the present invention avoids heavily doping the substrate which would be normally required when a single implant is used to form both the active and isolation regions.

In prior art devices, a thick field oxide by itself would normally prevent normal device voltages from causing current from flowing underneath the oxide. However, unless the oxide thickness is very large (>1 μm), thereby causing photolithographic step-coverage problems necessitating wide isolation spacing, leakage currents would flow resulting in device and circuit failure. The combination of a relatively thinner field oxide layer of a predetermined thickness and channel stop, as provided in accordance with the present invention, provides essentially complete device isolation and thus prevents device cross-talk. In particular, devices fabricated in accordance with the present invention have field oxide thresholds in the range from 15 V to about 25 V, thus ensuring device isolation despite the aforementioned body effect threshold shifts. For example, at 4 μm isolation spacing, 4000Å field oxide thickness, and 14 V, it has been determined that there is less than 1 pA subthreshold leakage in the field region. Even at 1 μm isolation, less than 1 pA is achieved up to 12 V. Thus requirements for rigorous isolation with high density NMOS ICs are met by the process. As noted, at 5 V operation, this isolation provides sufficient margin for field threshold shifts caused by high temperature ambients or ionizing radiation.

EXAMPLE

Figure 7:
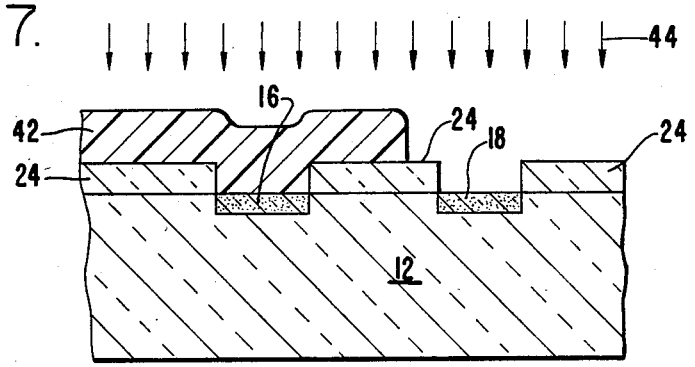

Device structures of the type shown in FIG. 7 have been fabricated with the following parameters: a silicon substrate 12 of thickness of 250 μm and a resistivity of 10–15 ohm-cm: a silicon dioxide layer 24 with a thickness of 4000Å; boron channel stoppers 40 implanted at an energy of 120 Ke V and a dosage of $1 \times 10^{13}$ ions/cm$^2$ with a corresponding isolation spacing of 4 μm; and a channel length of 1.5 μm implanted with boron at an energy of 20 Ke V and a dosage of $9 \times 10^{11}$ ion/cm$^2$ to form an enhancement mode device. Depletion mode devices were formed by additionally implanting the channel with arsenic at an energy of 60 Ke V and a dosage of $1.2 \times 10^{12}$ ion/cm$^2$.

The resulting active devices have excellent device characteristics. It has been determined that the threshold voltages were 0.25 V and −0.75 V for the enhancement and depletion mode FETs respectively, that there was no punchthrough current for a gate length of 1.25 μm at 5 V drain bias; that the body effect coefficients are very low (0.1 to 0.2) for both enhancement and depletion FETs, the latter having a channel length=2 μm, and that the device threshold remains constant as channel width decreases, i.e., there is no narrow-channel effect.

The present invention thus provides a novel process for fabricating high speed, high performance integrated circuits having a high packing density for VLSI circuits. Each active device isolation region on the chip occupies a minimum amount of substrate surface area by providing channel stops which are self-aligned to the field oxide. The present invention allows the channel stops to be doped independently from the doping of the channel regions of the active devices.

The active devices formed in the manner described hereinabove have the low junction capacitance and minimum body effect features necessary for high speed, high performance integrated circuits since the implant used for the channel stop does not introduce unwanted dopants into the active channel region, thereby allowing independent optimization of the doping concentrations for the active devices.

Thus, high density VLSI with excellent device isolation can be achieved by the process. The process employs a direct window self-aligned channel stop isolation in order to eliminate bird's beak and lateral dopant diffusion into the active area, thus avoiding narrowing of the active channel. The fabrication of the present invention is relatively simple to implement and provides a cost effective technique for fabricating high speed, high performance, integrated circuits.

It should be understood from the foregoing that many variations of the present invention are contemplated and that further modifications may be made in light of the above teachings. It is therefore to be understood that, within the scope of the appended claims, the invention may be practiced other than as specifically described.

What is claimed is:

1. A method of fabricating a MOSFET device, comprising a sequence of the following steps:
   (a) providing a substrate;
   (b) providing a field oxide layer on the surface of said substrate;
   (c) forming a patterned first mask over said field oxide layer defining the boundary of an active device area in said substrate;
   (d) removing that portion of said oxide layer exposed by said first mask so as to expose said active device area of said substrate, a resulting edge of said field oxide layer being aligned with a boundary point of said active device area;
   (e) doping said exposed active device area to form an active channel region;
   (f) providing a second mask layer overlying the surface of said substrate and removing said first mask so as to lift-off the overlying portion of said second mask layer to provide a second mask overlying said active area;
   (g) implanting ions into said substrate and masked field oxide at an energy level insufficient fo said ions to penetrate said second mask, but with sufficient energy to pass through said field oxide layer to form a channel stop self aligned to said field oxide layer and correspondingly aligned with said active device area; and
   (h) removing said second mask.

2. The method of claim 1 wherein said ions are implanted at an energy level in the range from about 120 KeV to about 200 KeV and at a dosage in the range from about $5 \times 10^{12}$ ions/cm$^2$ to about $1 \times 10^{13}$ ions/cm$^2$.

3. The method of claim 2 wherein the thickness of said field oxide layer is in the range from about 4000Å to about 6000Å.

4. The method of claim 3 wherein the step of doping said active device area of said substrate is performed prior to the step of providing said second mask and after said step of providing said field oxide layer.

5. The method of claim 1 wherein said step of doping said exposed active device area comprises ion implanting a dopant into said substrate, and the thickness of said implanted active channel region is in the range from about 0.1 μm to about 0.3 μm.

6. The method of claim 5 wherein said dopant is implanted at an energy level in the range from about 20 KeV to about 30 KeV at a dosage in the range from about $7 \times 10^{11}$ ions/cm$^2$ to about $1.5 \times 10^{12}$ ions/cm$^2$.

7. The method of claim 1 wherein said substrate comprises silicon.

8. The method of claim 7 wherein said field oxide layer comprises silicon dioxide.

9. The method of claim 1, 4 or 8 further comprising the steps of
   providing source and drain regions, gate oxide, and source, drain and gate contacts for said MOSFET device at said active device area.

10. The method of claim 1 wherein said patterned first mask comprises a photoresist layer, said second mask layer comprises a metal layer overlying said photoresist layer and said active area of said substrate, and wherein said step of removing said patterned first mask includes placing said substrate in a chemical organic solution to dissolve said photoresist and to lift-off the portion of said metal layer which overlays said photoresist.

* * * * *